(12) United States Patent
Matsumoto et al.

(10) Patent No.: US 7,972,962 B2
(45) Date of Patent: Jul. 5, 2011

(54) PLANARIZATION METHOD USING HYBRID OXIDE AND POLYSILICON CMP

(75) Inventors: David Matsumoto, San Jose, CA (US); Vidyut Gopal, Saratoga, CA (US)

(73) Assignees: Spansion LLC, Sunnyvale, CA (US); Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/887,182

(22) Filed: Sep. 21, 2010

(65) Prior Publication Data
US 2011/0008966 A1    Jan. 13, 2011

Related U.S. Application Data

(63) Continuation of application No. 11/551,390, filed on Oct. 20, 2006, now Pat. No. 7,829,464.

(51) Int. Cl.
*H01L 21/461* (2006.01)
*H01L 21/302* (2006.01)

(52) U.S. Cl. ......... 438/690; 438/691; 438/692; 438/693

(58) Field of Classification Search .................. None
See application file for complete search history.

(56) References Cited

U.S. PATENT DOCUMENTS

| | | | |
|---|---|---|---|
| 4,735,679 A | 4/1988 | Lasky | |
| 6,312,994 B1 | 11/2001 | Nakamura | |
| 6,478,977 B1 | 11/2002 | Moriyama et al. | |
| 6,693,226 B1 | 2/2004 | McNeish et al. | |
| 6,818,507 B2 | 11/2004 | Ueda | |
| 7,829,464 B2* | 11/2010 | Matsumoto et al. | 438/690 |
| 2006/0141790 A1 | 6/2006 | Kim et al. | |
| 2007/0007246 A1 | 1/2007 | Idani | |
| 2007/0026656 A1 | 2/2007 | Yu et al. | |

OTHER PUBLICATIONS

Co-pending U.S. Appl. No. 11/551,390, filed Oct. 20, 2006 entitled "Planarization method using hybrid oxide and polysilicon cmp" by David Matsumoto et al., 38 pages.

* cited by examiner

*Primary Examiner* — Duy-Vu N Deo
(74) *Attorney, Agent, or Firm* — Harrity & Harrity, LLP

(57) ABSTRACT

A method of planarizing a semiconductor device is provided. The semiconductor device includes a substrate, first and second components provided on the surface of the substrate, and a first material provided between and above the first and second components. The first component has a height greater than a height of the second component. The method includes performing a first polishing step on the semiconductor device to remove the first material above a top surface of the first component, to remove the first material above a top surface of the second component, and to level the top surface of the first component. The method also includes performing a second polishing step on the semiconductor device to planarize the top surfaces of the first and second components.

20 Claims, 9 Drawing Sheets

PLANARIZATION METHOD USING HYBRID OXIDE AND POLYSILICON CMP

RELATED APPLICATION

This application is a continuation of application Ser. No. 11/551,390, filed Oct. 20, 2006, the disclosure of which is incorporated herein.

BACKGROUND

1. Field of the Invention

Implementations described herein relate generally to semiconductor devices, and, more particularly, to a planarization method using a hybrid oxide and polysilicon chemical mechanical polishing and/or planarization (CMP).

2. Description of Related Art

The escalating demands for high density and performance associated with non-volatile memory devices require small design features, high reliability, and increased manufacturing throughput. The reduction of design features below a critical dimension (CD) challenges the limitations of conventional methodologies.

For example, after CMP, uneven topography may occur. A memory core of a semiconductor device, for example, may contain several memory cells having uneven topography. A peripheral component of the semiconductor device (e.g., a select transistor for a word line driver, a word line, etc.) may have uneven topography with the core memory cells as well. Topography height differences will cause problems in subsequent processing steps of the semiconductor device. However, elimination of uneven topography from semiconductor device components requires expensive lithography, masking, and etching steps. Thus, there is a need to eliminate extra topography and/or provide global planarization (e.g., a totally flat surface) across a semiconductor device without incurring the added expense of these extra manufacturing steps.

SUMMARY

According to one aspect, a method of planarizing a semiconductor device is provided. The semiconductor device may include a substrate and first and second components provided on the surface of the substrate. The first component may have a height greater than a height of the second component. The method may include providing a gap filling material between and above the first and second components, and polishing the semiconductor device to remove the gap filling material above a top surface of the first component. The method may also include polishing the semiconductor device to remove the gap filling material above a top surface of the second component and to level the top surface of the first component, and polishing the semiconductor device to planarize the top surfaces of the first and second components.

According to another aspect, a method of planarizing a semiconductor device is provided. The semiconductor device may include a substrate, first and second components provided on the surface of the substrate, and a first material provided between and above the first and second components. The first component may have a height greater than a height of the second component. The method may include performing a first polishing step on the semiconductor device to remove the first material above a top surface of the first component, to remove the first material above a top surface of the second component, and to level the top surface of the first component. The method may also include performing a second polishing step on the semiconductor device to planarize the top surfaces of the first and second components.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of the invention refers to the accompanying drawings. The same reference numbers in different drawings may identify the same or similar elements. Also, the following detailed description does not limit the invention.

Implementations consistent with principles of the invention may relate to planarization methods, in particular, chemical mechanical polishing and/or planarization (CMP) processes, which may be used to eliminate topography and/or topography variation on a semiconductor device. By utilizing the CMP processes according to implementations consistent with principles of the invention, extra topography and/or topography variations may be eliminated and/or global planarization may be provided across the semiconductor device without incurring the added expense of extra lithography, masking, and etching steps. For example, in one implementation, a hybrid CMP process may include a first CMP step that may remove a gap filling material (e.g., an oxide) above a semiconductor device component having the highest topography or profile, and/or may remove the gap filling material above the remaining components while leveling the topmost layers of components having profiles higher than the lowest profile component. In another implementation, the CMP process may include a second CMP step that may level and polish the topmost surfaces of the semiconductor device components.

Exemplary Semiconductor Devices

Figure 1:
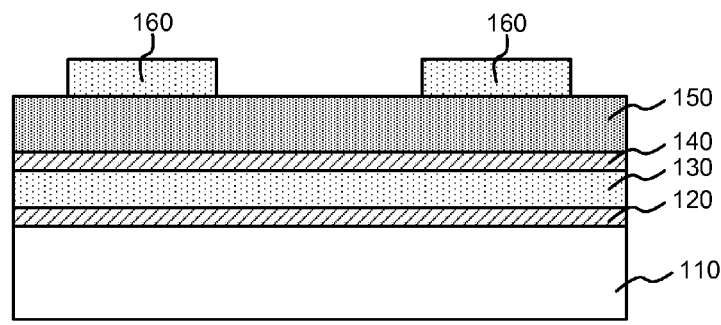
FIG. 1 is a cross-section of exemplary layers used to form a semiconductor device according to implementations consistent with principles of the invention.

FIG. 1 illustrates an exemplary cross-section of a semiconductor device 100 formed in accordance with implementations consistent with principles of the invention. As shown in FIG. 1, semiconductor device 100 may include layers 110, 120, 130, 140, and 150. In one implementation, layer 110 may correspond to a substrate of semiconductor device 100 and may include silicon, germanium, silicon-germanium or other semiconducting materials. In another implementation, layer 110 may correspond to a conductive layer or a dielectric layer formed a number of layers above the surface of a substrate in semiconductor device 100.

Layer 120 may correspond to a dielectric layer formed on layer 110 in a conventional manner. In one implementation, dielectric layer 120 may include an oxide, such as a silicon oxide (e.g., $SiO_2$), and may have a thickness ranging from, for example, about 30 angstroms (Å) to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, in one implementation, may act as a charge storage layer for semiconductor device 100 and may have a thickness ranging from, for example, about 40 Å to about 100 Å. In another implementation, layer 130 may include a conductive material, such as polycrystalline silicon, which may form a floating gate electrode. In this implementation, layer 130 may have a thickness ranging from about 500 Å to about 1,000 Å.

Layer 140 may be formed on layer 130 in a conventional manner and may include a dielectric material, such as an oxide (e.g., $SiO_2$). In one implementation, layer 140 may include another material having a high dielectric constant (K), such as aluminum oxide or hafnium oxide, which may be deposited or thermally grown on layer 130. In another implementation, layer 140 may be a composite that includes a number of dielectric layers or films. Layer 140 may have a thickness ranging from, for example, about 40 Å to about 100 Å and may function as an inter-gate dielectric for memory cells in semiconductor device 100.

Layer 150 may include a conductive material, e.g., polycrystalline silicon, formed on layer 140 in a conventional manner. Layer 150, in one implementation, may form one or more control gate electrodes for one or more memory cells in semiconductor device 100. In another implementation, layer 150 may have a thickness ranging from, for example, about 1,000 Å to about 2,000 Å.

A photoresist material may be patterned and etched to form masks 160 on the top surface of layer 150, as illustrated in FIG. 1. In one implementation, the particular configuration of masks 160 may be based on the particular circuit requirements associated with the memory cell for semiconductor device 100. For example, the photoresist material may be patterned and trimmed to form masks (e.g., masks 160) designed to achieve very small critical dimensions associated with a subsequently formed memory cell.

Figure 2:
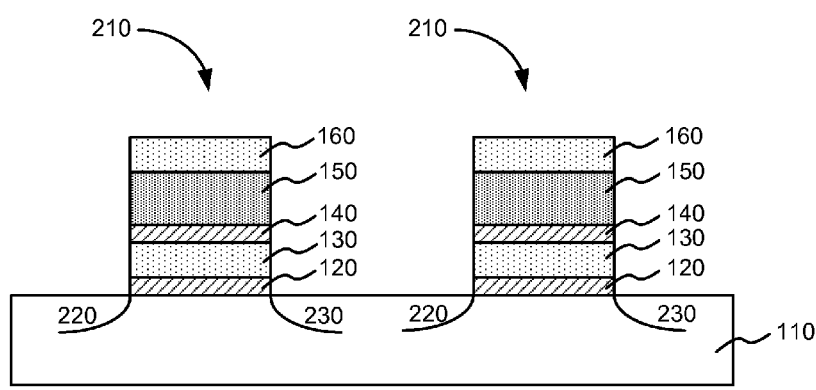
FIG. 2 is a cross-section illustrating the formation of memory cells according to implementations consistent with principles of the invention.

Semiconductor device 100 may be etched using masks 160 to achieve particular critical dimensions for each memory cell. FIG. 2 is a cross-section illustrating the formation of memory cells. Referring to FIG. 2, layers 120-150 may be etched, and the etching may terminate at substrate 110 to form structures 210. Alternatively, the etching may terminate at another layer, e.g., layer 140, followed in one implementation by additional etching, to form structures 210. Each structure 210 (also referred to herein as a memory cell 210) may represent a memory cell of semiconductor device 100. Each memory cell 210 may include a dielectric layer 120, a charge storage layer 130, an inter-gate dielectric layer 140, and a control gate electrode 150. Although only two memory cells 210 are illustrated in semiconductor device 100 of FIG. 2 for simplicity, semiconductor device 100 may include more or fewer memory cells 210. For example, semiconductor device 100 may include a memory array with a large number of memory cells 210. After etching, masks 160 may be stripped from semiconductor device 100 using a conventional process.

In an exemplary implementation consistent with principles of the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110. In another implementation, each memory cell 210 may be a floating gate memory cell, with a silicon control gate electrode 150, an inter-gate dielectric 140, a polysilicon floating gate electrode 130 and a tunnel oxide layer 120 formed on substrate 110.

As further shown in FIG. 2, source and drain regions 220 and 230 may be formed in substrate 110. For example, n-type or p-type impurities may be implanted in substrate 110 to form source and drain regions 220 and 230, based on the particular end device requirements. In one implementation, an n-type dopant, such as phosphorous or arsenic, may be implanted. In another implementation, a p-type dopant, such as boron, may be implanted. The particular implantation dosages and energy used to form source and drain regions 220 and 230 may be selected based on the particular end device requirements. Source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

In an implementation consistent with principles of the invention, another layer of a conductive material, e.g., polycrystalline silicon, may be formed and etched over gate electrodes 150 in a conventional manner. Additional conductive material layer may combine with gate electrodes 150, and the combination may be referred to hereinafter as gate electrodes 150.

In another implementation, spacers may be formed adjacent the sidewalls of memory cells 210. For example, a dielectric material (e.g., a silicon oxide, a silicon nitride, a silicon oxynitride or another dielectric material) may be deposited and etched to form spacers on each side of memory cells 210. The spacers may electrically isolate adjacent memory cells 210 from each other, and/or may be used to facilitate the deposition of impurities in semiconductor device 100.

In still another implementation, each memory cell 210 may be an EEPROM type memory device and one or more programming circuits (not shown) may facilitate programming and erasing of one or more memory cells 210 of semiconductor device 100. Programming of each memory cell 210 may be accomplished by applying a voltage to its control gate 150. Once programmed, electrons remain trapped in nitride layer 130 until an erase procedure is performed.

In an implementation consistent with principles of the invention, each memory cell 210 may be configured to store two or more bits of data. For example, charge storage layer 130 for each memory cell 210 may be programmed to store charges representing two separate bits of data by localizing the first and second charges to the respective left and right sides of charge storage layer 130 illustrated in FIG. 2. Each of the two bits of memory cell 210 may be programmed independently (e.g., by channel hot electron injection) to store charges representing a bit on each respective side of the charge storage layer 130. In this manner, the charges in charge storage layer 130 may become effectively trapped on each respective side of charge storage layer 130. Erasing of each bit in memory cell 210 may also be performed independently. During erasing, the charges stored in charge storage layer 130 may tunnel through dielectric layer 120 into source region 220 and drain region 230, respectively. In another implementation, charge storage layer 130 for each memory cell 210 may be configured to store charges representing three or more bits of data by localizing the charges in charge storage layer 130.

In an alternative implementation, each memory cell 210 may be configured to store a charge representing one bit of data per memory cell 210. In addition, in alternative implementations, semiconductor device 100 may be a floating gate memory device in which layer 130 is formed from a conductive material (e.g., polysilicon) that functions as a charge storage element for each memory cell 210.

Uneven Topography and Formation of Peripheral Component

Figure 3:
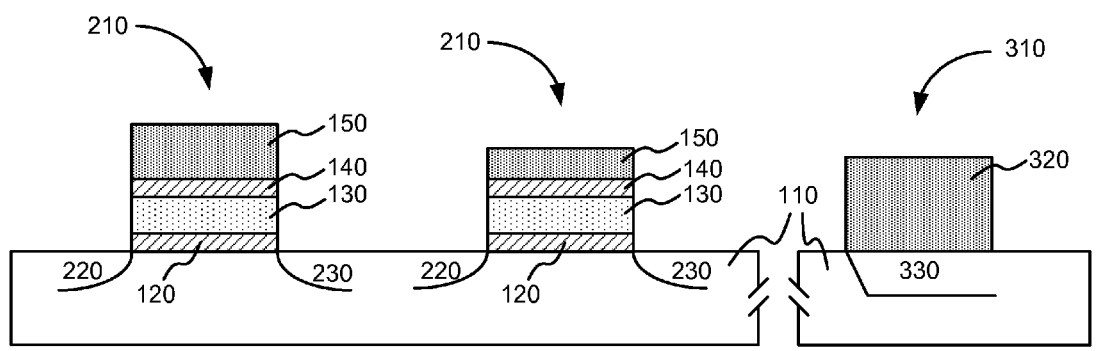
FIG. 3 is a cross-section illustrating the formation of uneven top layers on the memory cells of FIG. 2 and formation of a peripheral component according to implementations consistent with principles of the invention.

FIG. 3 is a cross-section illustrating the formation of uneven top layers on memory cells 210 of FIG. 2, and formation of a peripheral component according to implementations consistent with principles of the invention. As shown in FIG. 3, the topmost layers (e.g., control gate electrodes 150) of memory cells 210 may be uneven. For example, the top surface of control gate electrode 150 of memory cell 210 located to the left in FIG. 3 may have a height that may be greater than a height of the top surface of control gate electrode 150 of memory cell 210 located to the right in FIG. 3.

As further shown in FIG. 3, semiconductor device 100 may include a peripheral component 310. Peripheral component 310 may be a variety of components (e.g., a select transistor for a word line driver, a word line, etc.). For example, in one implementation, peripheral component 310 may include one or more layers, illustrated in FIG. 3 as single layer 320 for simplicity. In another implementation, peripheral component 310 may include the same layers included in memory cell 210. Layer 320 may be formed over a layer 330 formed in substrate 110. Layer 320 may include a conductive material, e.g., polycrystalline silicon, formed on layer 330 in a conventional manner. In one implementation, layer 320 may form a word line for semiconductor device 100. In still another implementation, layer 320 may have a thickness that may be dependent upon the type of device making up peripheral component 310.

Layer 330 may be formed in substrate 110 in a conventional manner and may include a dielectric material, such as an oxide (e.g., $SiO_2$). In one implementation, layer 330 may function as a shallow trench isolation (STI) region, and may include other materials, such as aluminum oxide, hafnium oxide, high density plasma (HDP) oxide, or plasma tetraethyl orthosilicate (TEOS), which may be deposited in a trench formed in substrate 110. In another implementation, layer 330 may be a composite that includes a number of dielectric layers or films. Layer 330 may have a thickness that may be dependent upon the type of device making up peripheral component 310.

As further shown in FIG. 3, the top surface of layer 320 of peripheral component 310 may have a height that may be less than the heights of the top surfaces of control gate electrodes 150 of memory cells 210. Such an arrangement may provide uneven topography for the components of semiconductor device 100. The topography height differences may cause problems in subsequent process steps unless extra and expensive lithography, masking, and etching processes are utilized to eliminate the height differences. However, as described below, the topography height differences may be eliminated with planarization methods according to implementations consistent with principles of the invention, without the need for such extra and expensive processes. Such topography height differences may be caused by differences in thickness between the topmost layers of peripheral component 310 and memory cells 210, by processing exposed to layer 330, the topography of layer 330, etc.

Figure 4:
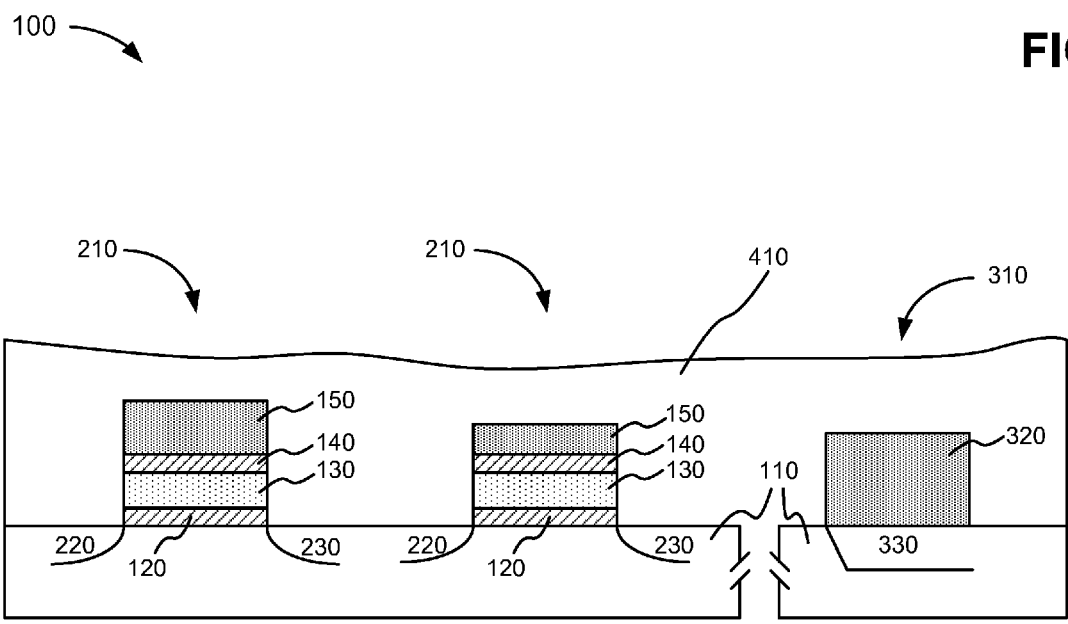
FIG. 4 is a cross-section illustrating the formation of a gap filling interlayer dielectric on the device of FIG. 3.

A gap filling material (e.g., a dielectric layer 410) may be deposited over semiconductor device 100, as illustrated in FIG. 4. Dielectric layer 410, also referred to as interlayer dielectric (ILD) 410, may include, for example, an oxide (e.g., silicon dioxide ($SiO_2$)), a boro-phosphosilicate glass (BPSG) material or a phosphosilicate glass (PSG) material. ILD 410 may have a thickness ranging from, for example, about 1,000 Å to about 10,000 Å, depending upon the heights of the components (e.g., memory cells 210 and/or peripheral component 310) of semiconductor device 100.

ILD 410 may be planarized using a process, such as a CMP process, as described below. The CMP process may planarize the top surface of ILD 410 to facilitate formation of subsequent structures, such as interconnect lines. In one implementation, ILD 410 may represent an ILD located closest to substrate 110. In another implementation, ILD 410 may represent an interlayer dielectric formed a number of layers above the surface of substrate 110. In each case, ILD 410 may function to isolate various conductive structures or to isolate source region 220 or drain region 230 from other conductive structures.

Although only a single peripheral component 310 is illustrated in semiconductor device 100 of FIG. 3 for simplicity, semiconductor device 100 may include more or fewer peripheral components 310. For example, semiconductor device 100 may include multiple peripheral components 310.

CMP Processes to Eliminate Topography Differences

Figure 5:
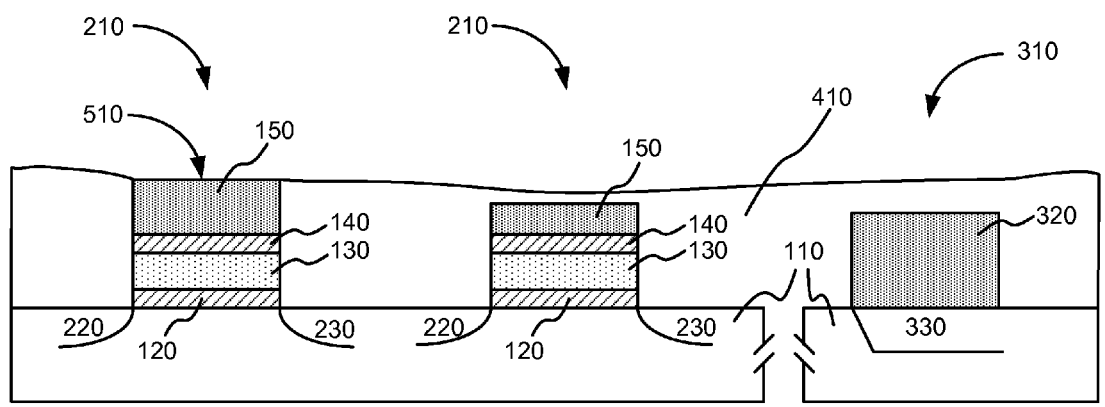
FIG. 5 is a cross-section illustrating the device of FIG. 4 after a first CMP step according to an implementation consistent with principles of the invention polishes the interlayer dielectric to a top surface of one of the memory cells of FIG. 4.
Figure 6:
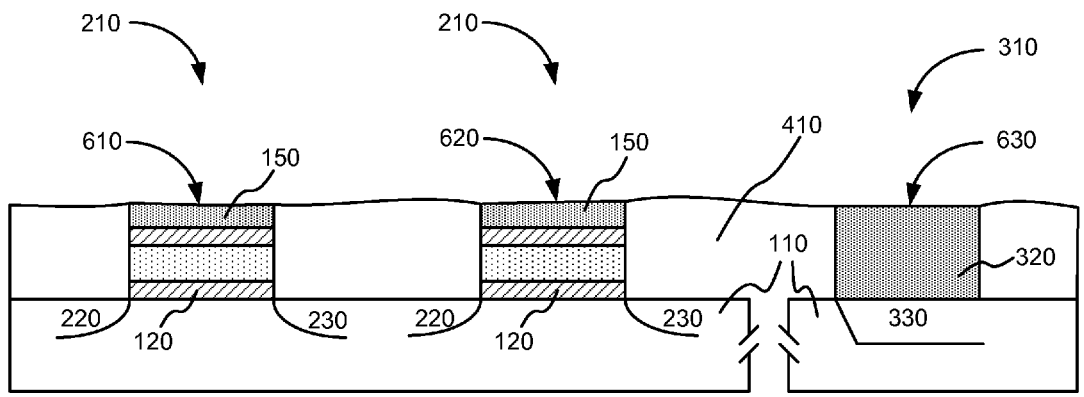
FIG. 6 is a cross-section illustrating the device of FIG. 5 after the first CMP step polishes the interlayer dielectric to the top surfaces of the memory cells and the peripheral component and/or levels the topmost layers of the memory cells.
Figure 7:
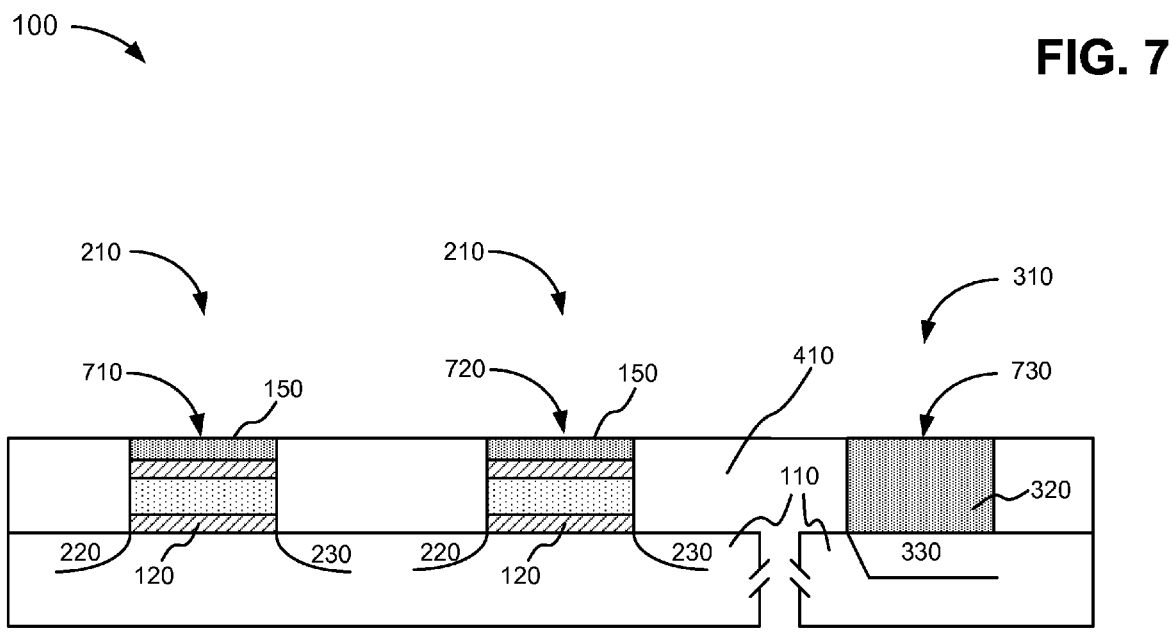
FIG. 7 is a cross-section illustrating the device of FIG. 6 after a second CMP step according to an implementation consistent with principles of the invention levels and polishes the topmost layers of the memory cells and the peripheral component.

FIGS. 5-7 illustrate the CMP processes according to implementations consistent with principles of the invention for elimination of topography differences in semiconductor device 100. In one implementation, the CMP processes may include a two step hybrid polishing and planarization process. CMP processes may involve similar processes for both polishing and planarization. For example, a semiconductor device (e.g., semiconductor device 100) may be mounted on a rotating platen. A rotating polishing pad may be pressured against the semiconductor device (e.g., semiconductor device 100) surface. A slurry carrying small abrasive particles may be flowed onto the platen. The particles may attack and remove small pieces of the semiconductor device surface which may be carried away by the movement of the slurry across the surface. The combined actions of the two rotations and abrasive slurry may polish the semiconductor device surface. High topography on the semiconductor device (e.g., semiconductor device 100) may be polished first and faster than lower areas, thus achieving planarization. This may be referred to as mechanical polishing actions.

The polishing pad may be made from a variety of materials. For example, the polishing pad may be made of cast polyurethane foam with fillers, polyurethane impregnated felts, or other similar materials. Pad properties may include porosity, compressibility, and/or hardness. Porosity, which may be measured as the specific gravity of the material, may govern the ability of the pad to deliver slurry in its pores and/or remove material with the pore walls. Compressibility and hardness may relate to the ability of the pad to conform to the initial surface irregularities. Generally, the harder the pad, the more global and faster the planarization. Softer pads may tend to contact both the high and low topography on the semiconductor device which may cause non-planar polishing. Another approach may utilize flexible polishing pads that may allow conformity to the initial semiconductor device surface.

Slurry chemistry may play a dual role. On the mechanical side, the slurry may carry abrasives. Small pieces of silica (e.g., silicon dioxide) may be used for oxide polishing. Alumina (e.g., $Al_2O_3$) may be used for metals polishing. Multimetal surfaces in semiconductor devices may use more universal abrasives. The abrasives may have a variety of diameters. For example, in one implementation, abrasives may have diameters ranging from, for example, about 10 nanometers (nm) to about 300 nm to achieve polishing. On the chemical side, the etchant in the slurry may be a basic solution (e.g., potassium hydroxide (KOH) or ammonium hydroxide ($NH_4OH$)) for silicon or silicon dioxide polishing and planarization. For metals, such as copper, reactions may start with an oxidation of the metal from the water in the slurry. Following the oxidation, the basic materials may chemically reduce the oxidized film which may be removed by the mechanical actions.

Various additives performing various roles may be provided in the slurry. For example, reducing post-CMP surface residues may be addressed by balancing the pH (e.g., the degree of acidity or alkalinity) of the slurry to control electrical charges on the abrasive particles. Other additives may include surfactants to establish desired flow characteristics and chelating agents. These latter agents may interact with metal particles to reduce their redeposition on the semiconductor device surface.

Many process factors may influence the CMP polishing rate. For example, pad material parameters, the slurry types and size, and/or the chemicals used may be factors. Other process factors may include the pad pressure, the rotation rates (e.g., of the pad and/or the platen), the flow rate of the slurry, the flow property (e.g., viscosity) of the slurry, the temperature and humidity of the polishing chamber, the semiconductor device diameter, the component pattern sizes, and/or the semiconductor device surface materials. These factors may be balanced to achieve a productive polish rate that may be properly controlled.

The CMP processes according to implementations consistent with principles of the invention may include a two step hybrid polishing and planarization process. A first step may include removal of ILD 410 (e.g., oxide) over the top surfaces of the components (e.g., memory cells 210 and peripheral component 310) of the semiconductor device. A second step may include a final planarization and smoothing of the top surfaces of the semiconductor device components.

FIG. 5 is a cross-section illustrating the device of FIG. 4 after the first CMP step according to an implementation consistent with principles of the invention polishes ILD 410 to a top surface 510 of one of memory cells 210 of FIG. 4. The first CMP step may include, for example, providing an oxide slurry (e.g., a silica-based oxide slurry) in a CMP tool. A variety of factors that influence the CMP polishing rate may be adjusted to optimize the first CMP step. In one implementation, for example, the pad pressure and the rotation rates of the polishing pad and/or platen may be adjusted. If ILD 410 is thick, then a higher pad pressure and higher pad and/or platen rotation rates may be used to remove ILD 410 quickly, which may increase production throughput. In one implementation, a pad pressure ranging from, for example, about 4 pounds per square inch (psi) to about 6 psi may be used to remove ILD 410 above the highest topography component of semiconductor device 100. In another implementation, a pad and/or platen rotation rate ranging from, for example, about 90 revolutions per minute (rpm) to about 120 rpm may be used to remove ILD 410 above the highest topography component of semiconductor device 100. In still another implementation, a combination of the aforementioned pad pressure ranges and rotation rate ranges may be used to remove ILD 410 above the highest topography component of semiconductor device 100 in an efficient manner.

As shown in FIG. 5, the pad pressure and rotation rates may remove ILD 410 above memory cell 210 located to the left in FIG. 5, which may be the highest topography component of semiconductor device 100. Removal of ILD 410 may expose top surface 510 (e.g., the top surface of layer 150) of memory cell 210.

Once the top surface of the highest topography component of semiconductor device 100 is exposed, the pad pressure and/or the pad/platen rotation rates may be adjusted. In one implementation, for example, the pad pressure and/or pad/platen rotation rates may be reduced to remove the ILD 410 over the remaining components of semiconductor device 100 and to level the top surfaces of the higher topography components (e.g., memory cells 210). FIG. 6 is a cross-section illustrating the device of FIG. 5 after the first CMP step polishes ILD 410 to top surfaces 610 and 620 of memory cells 210 and to a top surface 630 of peripheral component 310, and/or levels the topmost layers of memory cells 210.

The factors influencing the CMP polishing rate may be optimized to achieve a polishing rate of about 1:1. A polishing rate of about 1:1 may indicate that the oxide of ILD 410 and the polycrystalline of top surfaces 610 and 620 of the highest topography components (e.g., memory cells 210) may be polished (e.g., material removed) about equally. That is, the oxide to polycrystalline polish ratio may be about 1:1. In one implementation, a lower pad pressure than used in the first process may be used. For example, a pad pressure ranging from, for example, about 1.5 psi to about 4 psi may be used to remove ILD 410 above the lowest topography component of semiconductor device 100, and/or to level surfaces 610 and 620 of memory cells 210. In another implementation, a pad and/or platen rotation rate ranging from, for example, about 30 rpm to about 90 rpm may be used to remove ILD 410 above the lowest topography component of semiconductor device 100, and/or to level surfaces 610 and 620 of memory cells 210. In still another implementation, a combination of the aforementioned pad pressure ranges and rotation rate ranges may be used to remove ILD 410 above the lowest topography component of semiconductor device 100 and/or to level surfaces 610 and 620.

Once ILD 410 is removed above the lowest topography component (e.g., peripheral component 310) of semiconductor device 100, the second CMP step may be performed. FIG. 7 is a cross-section illustrating the device of FIG. 6 after the second CMP step according to an implementation consistent with principles of the invention levels and polishes top surfaces 710 and 720 of memory cells 210 and a top surface 730 of peripheral component 310. The second CMP step may include, for example, providing a polycrystalline silicon-based slurry in a CMP tool.

A variety of factors that influence the CMP polishing rate may be adjusted to optimize the second CMP step. For example, the pad pressure and/or the pad/platen rotation rates may be optimized to achieve ideal flatness for top surfaces (e.g., surfaces 710-730) of components (e.g., memory cells 210 and/or peripheral component 310) of semiconductor device 100. A small amount of top surfaces (e.g., surfaces 710-730) of the semiconductor device components may be polished, which may warrant lower polishing rates for process control. Lower polishing rates may be achieved in a variety of ways. In one implementation, for example, a pad pressure of about less than or equal to 4 psi may be used for the second CMP step. In another implementation, a pad and/or platen rotation rate of about less than or equal to 90 rpm may be used for the second CMP step. In still another implementation, a lower rate slurry formulation may be selected dependent on the remaining amounts of top surfaces (e.g. surfaces 710-730). For example, a slurry formulation may be provided such that a polishing rate of about less than or equal to 500 Å per minute may be achieved. In still a further implementation, an optimal combination of the aforementioned pad pressures, rotation rates, and/or slurry formulations may be used to achieve the desired planarization. As illustrated in FIG. 7, the top surfaces of memory cells 210 and peripheral component 310 may be substantially co-planar. In addition, the top surface of ILD 410 may be substantially co-planar with the top surfaces of components 210 and 310.

Although the figures show peripheral component 310 with the lowest topography, in one implementation consistent with principles of the invention, either core component of semiconductor device 100 (e.g., either memory cell 210) may include the lowest topography. Furthermore, although semiconductor device 100 of the figures shows memory cells 210 and peripheral component 310, semiconductor 100 may include a variety of components. For example semiconductor device 100 may include other core components (e.g., gates, interconnect lines for flash memory, etc.), other periphery components (e.g., select transistors for word line drivers, word lines, etc.), etc. Still further, the planarization methods according to implementations consistent with principles of the invention may be used for any semiconductor device having uneven components. Although the figures show three components of semiconductor device 100 (e.g., two memory cells 210 and peripheral component 310), semiconductor device 100 may include more or less components than shown in the figures. In each case, the top surfaces of memory cells 210 and peripheral component 310 may be substantially co-planar. This may facilitate deposition of additional layers on semiconductor device 100. For example, additional ILDs and/or conductive lines may be formed over the surface of semiconductor device 100. The substantially co-planar surfaces 100 may facilitate such depositions without irregularities that could affect device performance.

By utilizing the CMP processes according to implementations consistent with principles of the invention, extra and/or uneven topography may be eliminated and/or global planarization may be provided across a semiconductor device (e.g., semiconductor device 100) without incurring the added expense of extra lithography, masking, and etching steps. The CMP processes may planarize the top surfaces of semiconductor device components to facilitate formation of subsequent structures. This may prevent potential problems in subsequent processing steps of the semiconductor device. Furthermore, in one implementation, the CMP processes may be performed in a single CMP tool. In another implementation, the CMP processes may be performed in multiple CMP tools.

Exemplary Processes

Figure 8A:
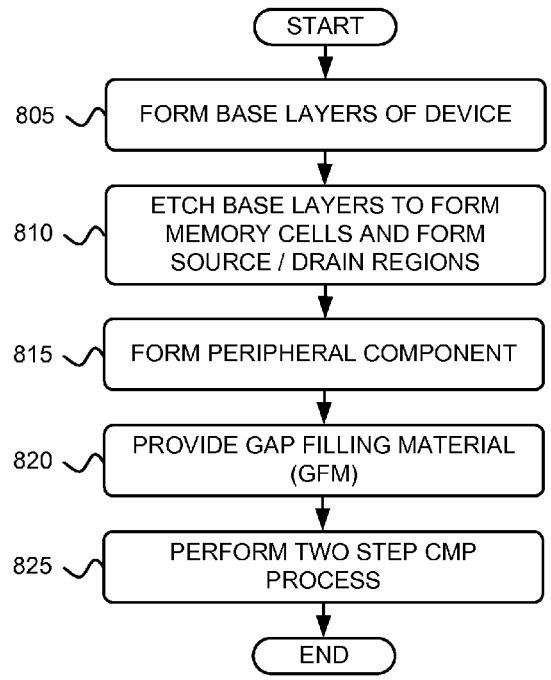
FIGS. 8A and 8B are flowcharts of exemplary processes according to implementations consistent with principles of the invention.
Figure 8B:
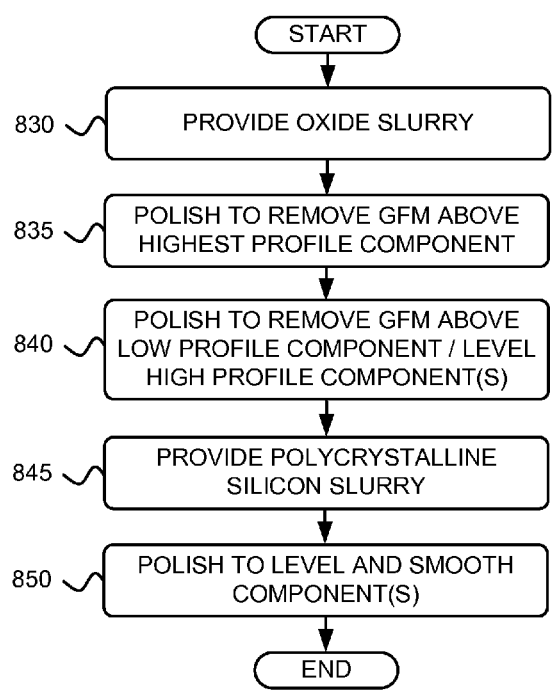

FIGS. 8A and 8B are flowcharts of exemplary processes according to implementations consistent with principles of the invention. As shown in FIG. 8A, a process 800 may form base layers of a semiconductor device (block 805). For example, in one implementation described above in connection with FIG. 1, semiconductor device 100 may be formed from base layers that include substrate layer 110, first dielectric layer 120 formed on substrate layer 110, charge storage layer 130 formed on first dielectric layer 120, second dielectric layer 140 formed on charge storage layer 130, and conductive layer 150 formed on second dielectric layer 140.

Process 800 may etch the base layers of the semiconductor device to form memory cell(s) and form source and/or drain regions (block 810). For example, in one implementation described above in connection with FIGS. 1 and 2, a photoresist material may be patterned and etched to form masks 160 on the top surface of conductive layer 150. Layers 120-150 may be etched, and the etching may terminate at substrate 110 and form memory cells 210. Alternatively, the etching may terminate at another layer, e.g., layer 140, followed in one implementation by additional etching, to form memory cells 210. In one implementation described above in connection with FIG. 2, source regions 220 and drain regions 230 may be formed in substrate 110. For example, n-type or p-type impurities may be implanted in substrate 110 to form source regions 220 and drain regions 230, based on the particular end device requirements.

As further shown in FIG. 8A, process 800 may form a peripheral component of the semiconductor device (block 815). For example, in one implementation described above in connection with FIG. 3, peripheral component 310 may be formed for semiconductor device 100. Peripheral component 310 may be a variety of components (e.g., a select transistor for a word line driver, a word line, etc.). Furthermore, peripheral component 310 may be formed earlier or concurrently with formation of memory cells 210.

Process 800 may provide a gap filling material (GFM) over the semiconductor device (block 820). For example, in one implementation described above in connection with FIG. 4, a gap filling material (e.g., a dielectric layer 410), also referred to as interlayer dielectric (ILD) 410, may be provided over semiconductor device 100. ILD 410 may include, for example, an oxide (e.g., $SiO_2$), a BPSG material or a PSG material. ILD 410 may have a thickness ranging from, for example, about 6,000 Å to about 10,000 Å, depending upon the heights of the components (e.g., memory cells 210 and/or peripheral component 310) of semiconductor device 100.

Process 800 may perform a two step CMP process on the semiconductor device (block 825). The two step CMP process (block 825) may include the process blocks shown in FIG. 8B. As shown in FIG. 8B, process 825 may provide an oxide slurry in a CMP tool (block 830). For example, in one implementation described above in connection with FIG. 5, the first CMP step may include, for example, providing an oxide slurry (e.g., a silica-based oxide slurry) in a CMP tool.

Process 825 may perform a polish to remove the gap filling material above the highest profile component of the semiconductor device (block 835). For example, in one implementation described above in connection with FIG. 5, if ILD 410 is thick, then a higher pad pressure and higher pad and/or platen rotation rates may be used to remove ILD 410 quickly. In one implementation, a pad pressure ranging from, for example, about 4 psi to about 6 psi may be used to remove ILD 410 above the highest topography component of semiconductor device 100. In another implementation, a pad and/or platen rotation rate ranging from, for example, about 90 rpm to about 120 rpm may be used to remove ILD 410 above the highest topography component of semiconductor device 100. In still another implementation, a combination of the aforementioned pad pressure ranges and rotation rate ranges may be used.

As further shown in FIG. 8B, process 825 may perform a polish to remove the gap filling material above the lowest profile component and to level higher profile component(s) (block 840). For example, in one implementation described above in connection with FIG. 6, a pad pressure ranging from, for example, about 1.5 psi to about 4 psi may be used to remove ILD 410 above the lowest topography component of semiconductor device 100, and/or to level surfaces 610 and 620 of memory cells 210. In another implementation, a pad and/or platen rotation rate ranging from, for example, about 30 rpm to about 90 rpm may be used to remove ILD 410 above the lowest topography component of semiconductor device 100, and/or to level surfaces 610 and 620 of memory cells 210. In still another implementation, a combination of the aforementioned pad pressure ranges and rotation rate ranges may be used.

Process 825 may provide a polycrystalline silicon slurry in a CMP tool (block 845). For example, in one implementation described above in connection with FIG. 7, once ILD 410 is removed above the lowest topography component (e.g., peripheral component 310) of semiconductor device 100, the second CMP step may be performed. The second CMP step may include, for example, providing a polycrystalline silicon-based slurry in a CMP tool.

As further shown in FIG. 8B, process 825 may perform a polish to provide final component(s) leveling and/or smoothing (block 850). For example, in one implementation described above in connection with FIG. 7, a pad pressure of about less than or equal to 4 psi may be used for the second CMP step. In another implementation, a pad and/or platen rotation rate of about less than or equal to 90 rpm may be used for the second CMP step. In still another implementation, a lower rate slurry formulation may be selected depending on the remaining amounts of top surfaces (e.g. surfaces 710-730). For example, a slurry formulation may be provided such that a polishing rate of about less than or equal to 500 Å per minute may be achieved. In still a further implementation, an optimal combination of the aforementioned pad pressures, rotation rates, and/or slurry formulations may be used.

CONCLUSION

Implementations consistent with principles of the invention may relate to planarization methods, in particular, CMP processes, that may be used to eliminate topography and/or topography variations on a semiconductor device. By utilizing the CMP processes according to implementations consistent with principles of the invention, extra topography may be eliminated and/or global planarization may be provided across the semiconductor device without incurring the added expense of extra lithography, masking, and etching steps. For example, in one implementation, a hybrid CMP process may include a first CMP step that may remove a gap filling material (e.g., an oxide) above a semiconductor device component having the highest topography or profile, and/or may remove the gap filling material above the remaining components while leveling topmost layers of components having topography higher than the lowest profile component. In another implementation, the CMP process may include a second CMP step that may level and polish the topmost surfaces of the semiconductor device components.

The foregoing description of preferred embodiments provides illustrations and descriptions, but is not intended to be exhaustive or to limit the invention to the precise form disclosed. Modifications and variations are possible in light of the above teachings or may be acquired from practice of the invention.

For example, numerous specific details are set forth, such as specific materials, structures, chemicals, processes, etc., in order to provide a thorough understanding of the invention. However, implementations consistent with principles of the invention may be practiced without resorting to the details specifically set forth herein. In other instances, well known processing structures have not been described in detail, in order not to unnecessarily obscure the thrust of the invention.

Furthermore, while a series of acts has been described with regard to FIGS. 8A and 8B, the order of the acts may be modified in other implementations consistent with principles of the invention. Further, non-dependent acts may be performed in parallel.

As described above, semiconductor device 100 consistent with principles of the invention may be a SONOS type memory device, and/or a floating gate memory device. Such a semiconductor device 100 may be used for a variety of applications. For example, semiconductor device 100 may be used in chip sets included in computers, e.g., a personal computer, a laptop, a printer, a monitor, etc., and consumer electronics (e.g., a camera, a calculator, a television, stereo equipment, a radio, a home entertainment system, an MP3 player, a DVD player, video game systems, etc.).

Semiconductor device 100 may also be used in telecommunications equipment, e.g., a radiotelephone handset; a personal communications system (PCS) terminal that may combine a cellular radiotelephone with data processing, a facsimile, and data communications capabilities; a personal digital assistant (PDA) that can include a radiotelephone, pager, Internet/intranet access, web browser, organizer, calendar, a camera, a sound recorder, a Doppler receiver, and/or global positioning system (GPS) receiver; a GPS device; etc.

Semiconductor device 100 may further be used in industrial applications, e.g., electronic sensors, electronic instruments, industrial control systems, network devices (e.g., a router, a switch, set top boxes, a network interface card (NIC), a hub, a bridge, etc.), etc., and automotive applications, e.g., engine control systems, safety control equipment (e.g., airbags, cruise control, collision avoidance, antilock brakes, etc.), and cockpit electronics (e.g., entertainment, instrumentation, phones, etc.), etc.

Although a variety of applications for semiconductor device 100 have been described, the list of applications for semiconductor device 100 is exemplary and may include other applications not mentioned above.

Implementations of the invention are applicable in the manufacturing of semiconductor devices and particularly in memory devices having small design features and high circuit density. The invention is also applicable to the formation of any of various other types of semiconductor devices in which high circuit density is important, and hence, details have not been set forth in order to avoid obscuring the thrust of the invention.

It should be emphasized that the term "comprises/comprising" when used in the this specification is taken to specify the presence of stated features, integers, steps or components but does not preclude the presence or addition of one or more other features, integers, steps, components or groups thereof.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method of planarizing a semiconductor device including a substrate and first and second components provided on the surface of the substrate, the method comprising:

providing a gap filling material between and above the first and second components to cover upper surfaces of the first and second components, the first component having a height greater than a height of the second component with respect to the surface of the substrate;

performing a first polishing operation, with an oxide-based slurry, on the semiconductor device to remove the gap filling material and expose a top surface of the first component and to remove a portion of the gap filling material above a top surface of the second component without exposing the top surface of the second component; and performing a second polishing operation, with a polycrystalline silicon-based slurry, on the semiconductor device to remove a remaining portion of the gap filling material and expose the top surface of the second component and to remove a portion of the top surface of the first component to level the top surface of the first component with respect to the top surface of the second component, where the oxide-based slurry is different than the polycrystalline silicon-based slurry.

2. The method of claim 1, further comprising:
polishing the semiconductor device at a rate of less than or equal to about five-hundred Angstroms (Å) per minute using the polycrystalline silicon-based slurry.

3. The method of claim 1, further comprising:
receiving selection of a first polishing rate for the first polishing operation; and
receiving selection of a second polishing rate for the second polishing operation,
where the selection of the first polishing rate is independent of the selection of the second polishing rate.

4. The method of claim 1, where performing the first polishing operation, with the oxide-based slurry, on the semiconductor device to remove the gap filling material above the top surface of the first component, further comprises:
providing a pad pressure for a polishing device ranging from about four pounds per square inch (psi) to about six psi.

5. The method of claim 4, where performing the first polishing operation, with the oxide-based slurry, on the semiconductor device to remove the gap filling material above the top surface of the first component, further comprises:
providing a rotation rate for the polishing device ranging from about ninety revolutions per minute (rpm) to about one-hundred and twenty rpm.

6. The method of claim 1, where performing the first polishing operation, with the oxide-based slurry, on the semiconductor device to remove the gap filling material above the top surface of the first component, further comprises:
providing a rotation rate for a polishing device ranging from about ninety revolutions per minute (rpm) to about one-hundred and twenty rpm.

7. The method of claim 1, where performing the second polishing operation, with the polycrystalline silicon-based slurry, on the semiconductor device to remove the remaining portion of the gap filling material above the top surface of the second component, further comprises:
providing a pad pressure for a polishing device ranging from about 1.5 pounds per square inch (psi) to about four psi.

8. The method of claim 7, where performing the second polishing operation, with the polycrystalline silicon-based slurry, on the semiconductor device to remove the remaining portion of the gap filling material above the top surface of the second component, further comprises:

providing a rotation rate for the polishing device ranging from about thirty revolutions per minute (rpm) to about ninety rpm.

9. The method of claim 1, where performing the second polishing operation, with the polycrystalline silicon-based slurry, on the semiconductor device to remove the remaining portion of the gap filling material above the top surface of the second component, further comprises:
providing a rotation rate for a polishing device ranging from about thirty revolutions per minute (rpm) to about ninety rpm.

10. The method of claim 1, where the second polishing operation planarizes the top surfaces of the first and second components, and comprises:
providing a pad pressure for a polishing device of about less than or equal to four pounds per square inch (psi).

11. The method of claim 10, where the second polishing operation further comprises:
providing a rotation rate for the polishing device of about less than or equal to ninety revolutions per minute (rpm).

12. The method of claim 1, where the second polishing operation planarizes the top surfaces of the first and second components, and comprises:
providing a rotation rate for a polishing device of about less than or equal to ninety revolutions per minute (rpm).

13. A method comprising:
providing first and second components on a substrate of a semiconductor device, where the first component has a height greater than a height of the second component with respect to a surface of the substrate;
providing a first material between and above the first and second components to cover upper surfaces of the first and second components;
performing a first polishing operation with an oxide type of slurry formulation on the semiconductor device to remove the first material above a top surface of the first component, to remove the first material above a top surface of the second component, and to level the top surface of the first component; and
performing a second polishing operation with a polycrystalline silicon type of slurry formulation on the semiconductor device to planarize the top surfaces of the first and second components, where the polycrystalline silicon type of slurry formulation is different than the oxide type of slurry formulation.

14. The method of claim 13, where the first polishing operation comprises:
providing a pad pressure for a polishing device ranging from about four pounds per square inch (psi) to about six psi and a rotation rate ranging from about ninety revolutions per minute (rpm) to about one-hundred and twenty rpm to remove the first material above the top surface of the first component; and
providing a pad pressure for the polishing device ranging from about 1.5 psi to about four psi and a rotation rate ranging from about thirty rpm to about ninety rpm to remove the first material above the top surface of the second component and to level the top surface of the first component.

15. The method of claim 13, where the second polishing operation comprises:
providing a pad pressure for the polishing device of less than or equal to about four pounds per square inch (psi); and
providing a rotation rate for the polishing device of less than or equal to about ninety revolutions per minute (rpm).

16. The method of claim 15, further comprising:
adjusting at least one of the pad pressure or the rotation rate to optimize the removal of the first material above the top surface of the second component and the leveling of the top surface of the first component.

17. The method of claim 15, further comprising:
adjusting at least one of the pad pressure or the rotation rate to planarize the top surfaces of the first and second components.

18. The method of claim 13, further comprising:
forming the first component, the first component comprising a memory cell stack formed in a core area of a memory device; and
forming the second component in an area adjacent to the core area of the memory device.

19. The method of claim 13, further comprising:
receiving selection of a first polishing rate for the first polishing operation; and
receiving selection of a second polishing rate for the second polishing operation,
where the selection of the first polishing rate is independent of the selection of the second polishing rate.

20. The method of claim 13, where the first material comprises one of an oxide, a boro-phosphosilicate glass (BPSG) material, or a phosphosilicate glass (PSG) material.

* * * * *